United States Patent [19]
Johnston et al.

[11] Patent Number: 4,884,243
[45] Date of Patent: Nov. 28, 1989

[54] MULTI-PORT, OPTICALLY ADDRESSED RAM

[75] Inventors: Alan R. Johnston, La Canada; Robert H. Nixon, Sunland; Larry A. Bergman, Van Nuys; Sadik Esener, La Jolla, all of Calif.

[73] Assignee: California Institute of Technology, Pasadena, Calif.

[21] Appl. No.: 157,692

[22] Filed: Feb. 19, 1988

[51] Int. Cl.$^4$ ................................................ G11C 8/00
[52] U.S. Cl. ...................................... 365/234; 365/64
[58] Field of Search ........................ 365/64, 215, 234; 357/30 R

[56] References Cited

U.S. PATENT DOCUMENTS

| | | | |
|---|---|---|---|
| 3,836,907 | 9/1974 | Nerzessian | 365/234 |
| 3,958,229 | 5/1976 | Dugway | 365/234 |
| 4,835,595 | 5/1989 | Oho et al. | 357/30 R |

*Primary Examiner*—Joseph A. Popek
*Attorney, Agent, or Firm*—Donald A. Streck; Luther P. Speck; Edward O. Ansell

[57] ABSTRACT

A random access memory addressing system utilizing optical links between memory and the read/write logic circuits comprises addressing circuits including a plurality of light signal sources, a plurality of optical gates including optical detectors associated with the memory cells, and a holographic optical element adapted to reflect and direct the light signals to the desired memory cell locations. More particularly, it is a multi-port, binary computer memory for interfacing with a plurality of computers. There are a plurality of storage cells for containing bits of binary information, the storage cells being disposed at the intersections of a plurality of row conductors and a plurality of column conductors. There is interfacing logic for receiving information from the computers directing access to ones of the storage cells. There are first light sources associated with the interfacing logic for transmitting a first light beam with the access information modulated thereon. First light detectors are associated with the storage cells for receiving the first light beam, for generating an electrical signal containing the access information, and for conducting the electrical signal to the one of the storage cells to which it is directed. There are holographic optical elements for reflecting the first light beam from the first light sources to the first light detectors.

31 Claims, 7 Drawing Sheets

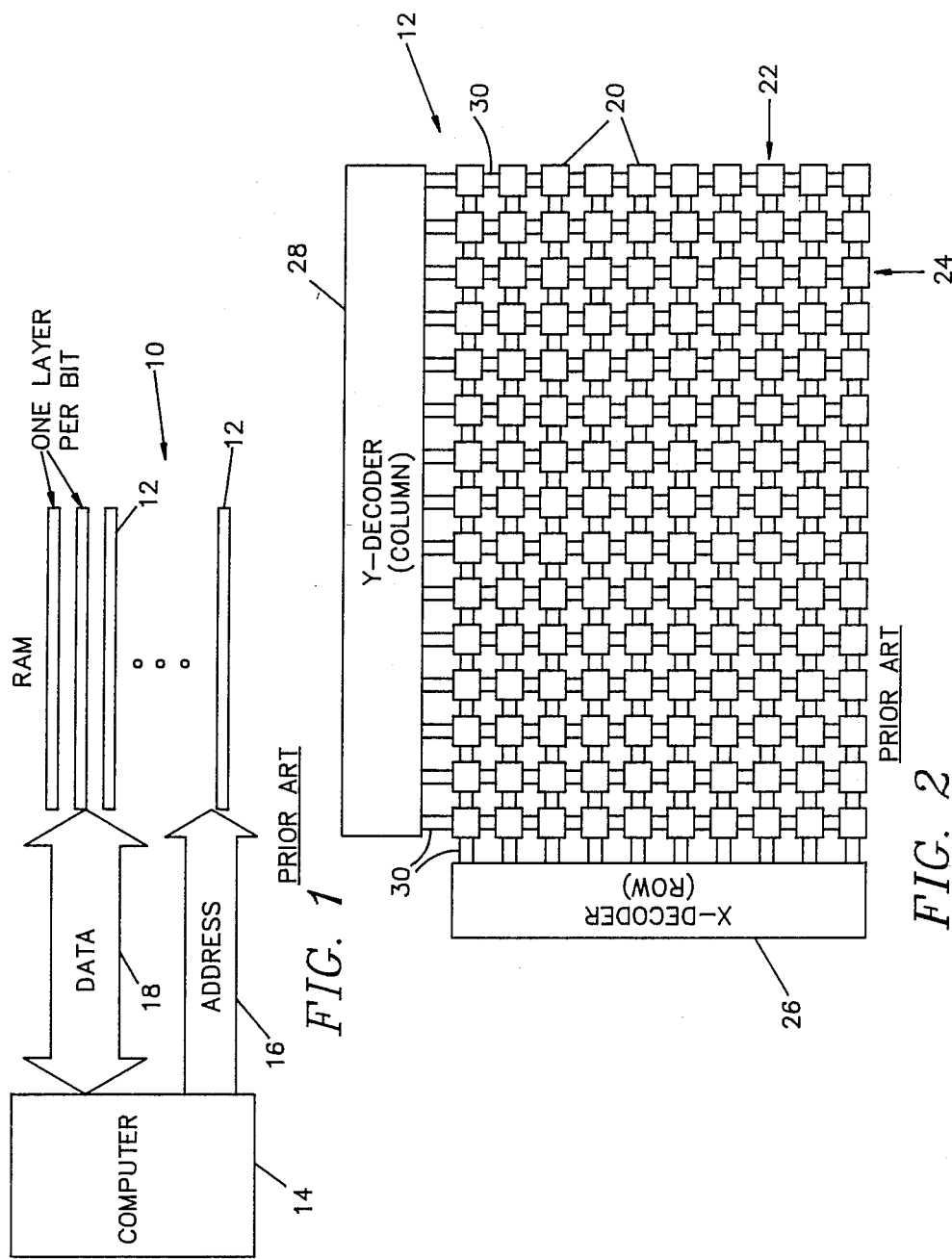

MULTI-PORT, OPTICALLY ADDRESSED RAM

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

The present invention relates to computer memory and, more particularly, in a binary computer memory having a plurality of storage cells for containing bits of binary information and logic for receiving information from an outside source directing access to ones of the storage cells, to the improvement comprising, first light source means associated with the logic for transmitting a first light beam with the access information modulated thereon; first light detecting means associated with the storage cells for receiving said first light beam, for generating an electrical signal containing the access information, and for conducting said electrical signal to the one of the storage cells to which it is directed; and, reflecting means for reflecting said first light beam from said first light source means to said first light detecting means.

A typical computer random access memory (RAM) and its manner of access is depicted in simplified form in FIG. 1. The RAM 10 is comprised of a plurality of layers 12 each containing one bit position of the words or bytes contained in the RAM 10. To read from or write to the RAM 10, the computer 14 sends an address of the data on parallel line 16 and the data is transferred over parallel line 18. The bit from each layer 12, of course, is accessed from its position on the parallel data line 18. Each layer 12 appears as shown in FIG. 2. The storage cells 20 for the individual bits are arranged in a rectangular matrix of rows 22 and columns 24. To access the bits in the cells 20, there is an X-decoder 26 which employs the row address information from the address line 16 and a Y-decoder 28 which employs the column address information from the address line 16. The two decoders 26, 28 then employ the address information provided to access the cell 20 (either to read or write) which is located at the intersection of the row and column specified. This mode of operation is well known to those skilled in the art.

Actual accessing of the cells 20 of a RAM such as 10 is conventionally done by means of metal or polysilicon conductive strips 30 connected from the decoders 26, 28 at the edges of the RAM chip to and interconnecting the plurality of memory cells 20. Dynamic RAM memories require the distribution of many different clock phases for addressing, refreshing, and sensing operations. Each cell 20 must be clocked periodically, both to retain and to shift its information to the next cell, for dynamic shift registers store information by circulating bits in bucket-brigade fashion. Distribution of these clock signals is also accomplished by the conductive strips 30 whose lengths often limit clock speed. By eliminating long strobe lines on the chip, higher clock speeds would be possible.

Static RAMs also require select and clock lines for addressing the individual memory cells 20. These cells are larger than their dynamic counterparts, owing to the larger number of active elements required to retain data without shifting. Although the individual memory cells themselves can be designed for speeds exceeding 50 MHz, or access delays significantly less than 20 nanoseconds, these speeds are seldom achieved due to transmission delays associated with the address and data lines that perform cell selection. On large RAMs, a large portion of this delay can be attributed to driving the highly resistive and capacitive loads of these lines.

All the conductive paths must be electrically isolated where they cross; the large number required introduces severe geometric restraints on circuit design. Additionally, polysilicon lines in CMOS circuits introduce significant delays which, in some cases, can limit the speed of the overall device.

STATEMENT OF THE INVENTION

This invention provides a method and apparatus for conducting signal within a RAM structure, or the like, which eliminate the above-described problems and limitation associated with the use of polysilicon conductive paths and similar materials. In particular, this invention provides for optical coupling between portions of a memory and the ability to provide a multi-ported memory for concurrent use by a plurality of computers without the access line limitations normally associated with attempts to provide such multi-user memory capability.

More specifically, this invention is a multi-port, binary computer memory for interfacing with a plurality of computers comprising, a plurality of storage cells for containing bits of binary information, the storage cells being disposed at the intersections of a plurality of row conductors and a plurality of column conductors; interfacing logic means for receiving information from the computers directing access to ones of the storage cells; first light source means associated with the interfacing logic means for transmitting a first light beam with the access information modulated thereon, the first light source means including a plurality of light beam-emitting sources corresponding to respective ones of the row conductors; first light detecting means associated with the storage cells for receiving the first light beam, for generating an electrical signal containing the access information, and for conducting the electrical signal to the on of the storage cells to which it is directed, the first light detector means including a plurality of light beam detectors inserted into respective ones of the row conductors to divide the row conductors into sub-rows; second light source means for transmitting a second light beam with the clock signal modulated thereon; a plurality of second light detecting means associated with the storage cells for receiving the second light beam, for generating an electrical clock signal therefrom, and for conducting the electrical clock signal to the ones of the storage cells associated with respective ones of the second light detecting means; and, reflecting means for reflecting the first light beam from the first light source means to the first light detecting means, the reflecting means including broadcast means for reflecting the second light beam from the second light source means to the plurality of second light detecting means.

In the preferred embodiment, the storage cells are disposed at the intersections of a plurality of row conductors and a plurality of column conductors and, the first light source means includes a plurality of light beam-emitting sources corresponding to respective ones of the row conductors; and, the first light detector means includes a plurality of light beam-detectors corresponding to respective ones of the row conductors. Additionally, the first light source means includes a plurality of light beam-emitting sources corresponding to respective ones of the column conductors; and, the first light detector means includes a plurality of light beam detectors corresponding to respective ones of the column conductors. For added performance capability, the first light source means includes a plurality of light beam-emitting sources corresponding to respective ones of the column conductors; and, the first light detector means includes a plurality of light beam detectors inserted into respective ones of the column conductors to divide the column conductors into sub-columns.

The preferred embodiment also comprises, data interfacing logic means connected to the storage cells for conducting data into and out of the storage cells; third light source means operably connected to the data interfacing logic means for transmitting to the computers a third light beam having data from the storage cells modulated thereon; third light detecting means operably connected to the data interfacing logic means for receiving from the computers a fourth light beam containing data to be written into the storage cells modulated thereon, for generating an electrical data signal therefrom, and for conducting the electrical data signal to the data interfacing logic means to be written by the data interfacing logic means into the ones of the storage cells to which it is directed; and, the reflecting means including means for reflecting the third light beam from the third light source means to the computers and for reflecting the fourth light beam from the computers to the third light detecting means.

BRIEF DESCRIPTION OF THE DRAWINGS

FIG. 1 is a simplified drawing of the manner in which a computer accesses data stored in a conventional RAM memory.

FIG. 2 is a simplified drawing showing the structure of a conventional RAM memory with interconnecting paths of a conductive material.

DETAILED DESCRIPTION OF THE INVENTION

Figure 4:
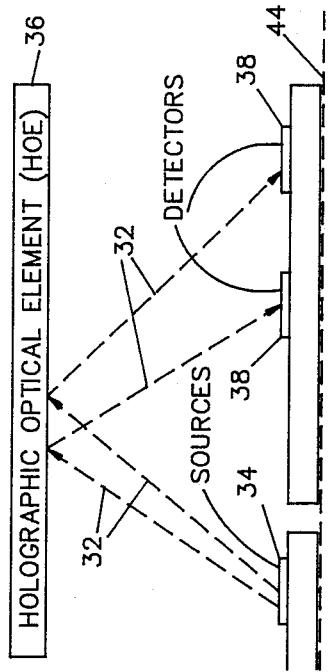
FIG. 4 is a simplified drawing showing a prior art use of a holographic optical element without a spatial light modulator to communicate between portions of computer chips.
Figure 3:
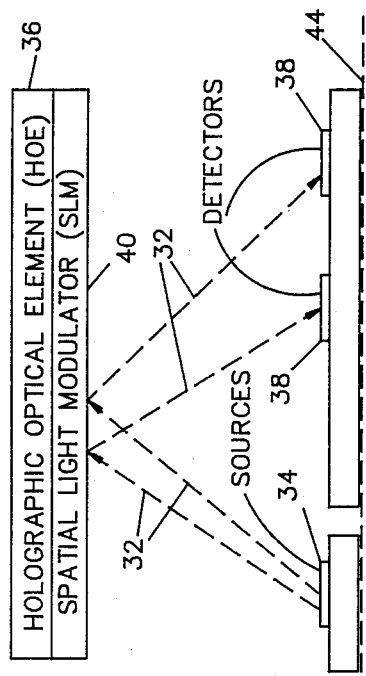
FIG. 3 is a simplified drawing showing a prior art use of a holographic optical element employing a spatial light modulator to communicate between portions of computer chips.
Figure 5:
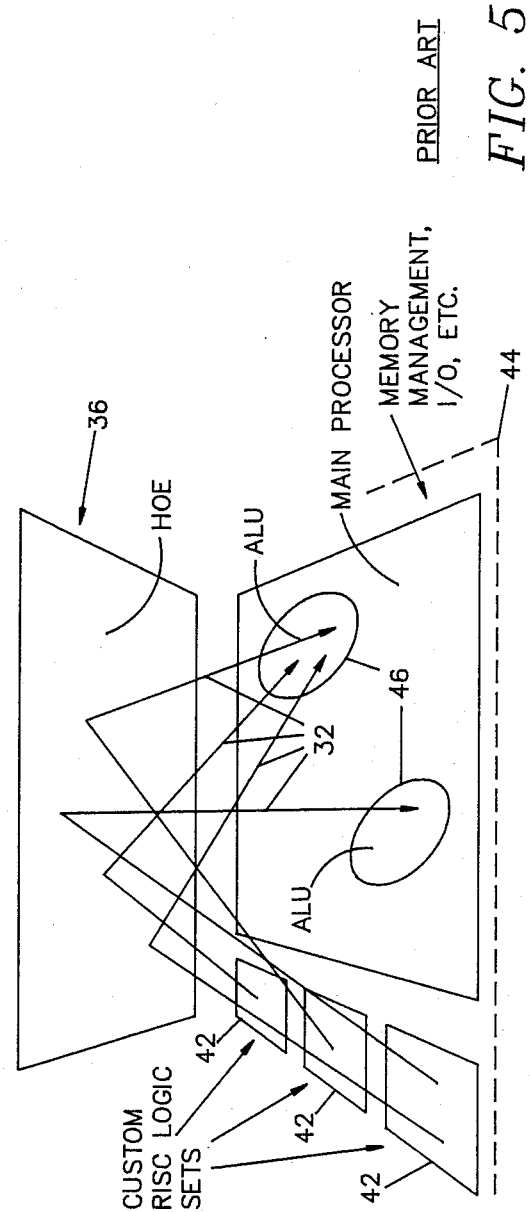
FIG. 5 is a simplified perspective drawing showing the manner is which the communications of FIGS. 3 and 4 can be accomplished and employed according to the prior art.

The solution to the problems and constraints of the prior art as described above is to address the RAM and distribute clock signals by means of light signals transmitted through three-dimensional space, thus reducing geometric constraints and improving operating speed. Such techniques are known in the art and are shown in FIGS. 3-5. As depicted in FIGS. 3 and 4, data/clock-modulated light beams 32 from sources 34 can be reflected from a holographic optical element (HOE) 36 to a detector 38 at a removed location on the same or another chip. A spatial light modulator (SLM) 40 can be employed to controlably switch the beams 32 as shown in FIG. 3 or the beams can be switched by selectively turning the sources 34 off and on. Thus, as depicted in FIG. 5, such optical interconnections have been suggested as being useful for interconnecting between custom RISC logic sets 42 on one part of a computer board 44 and arithmetic and logic (ALU) logic 46 on another part.

Figure 6:
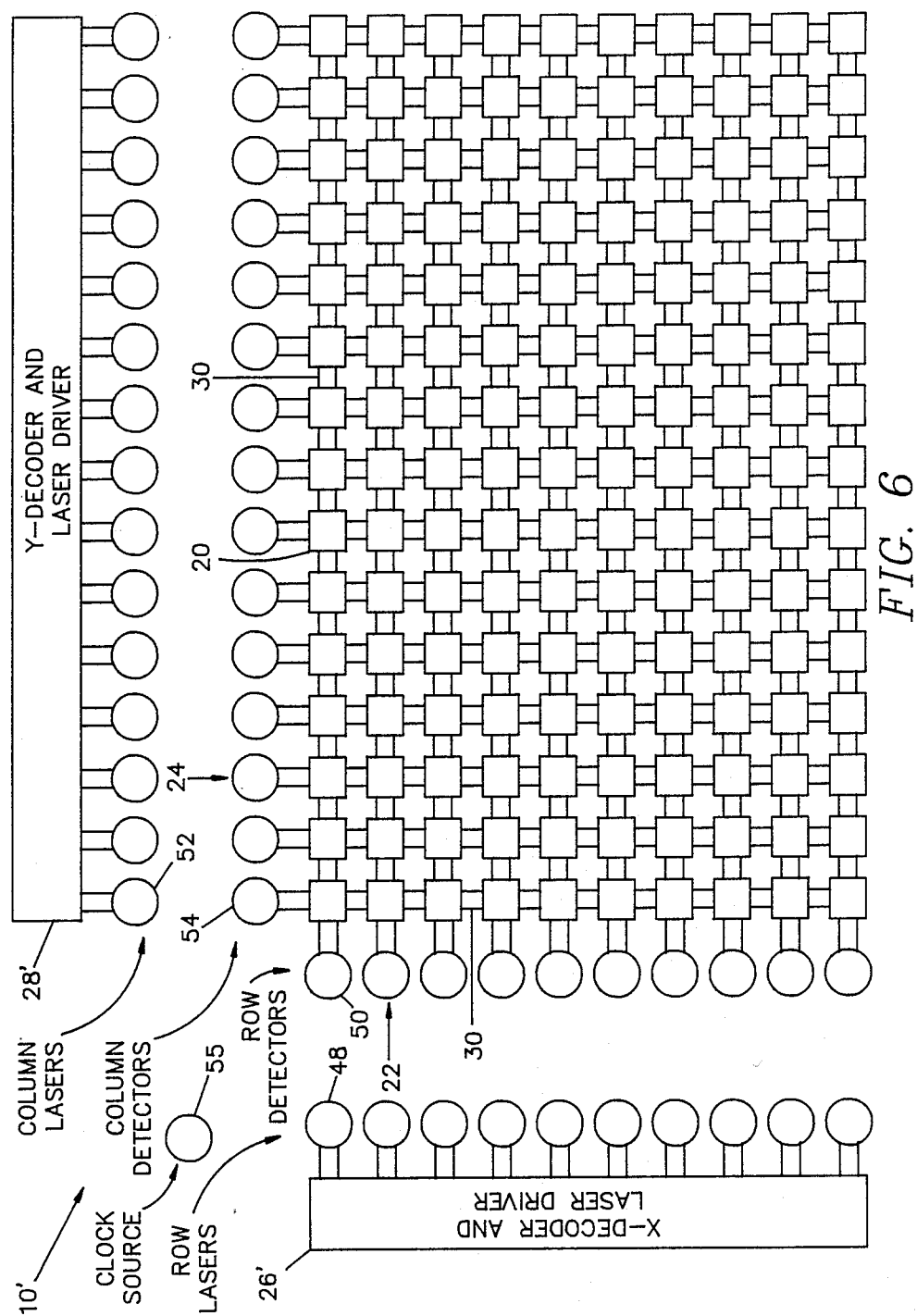
FIG. 6 is a simplified plan view of a memory according to the present invention in a basic embodiment employing optical interconnections.

FIG. 6 illustrates a general schematic of addressing RAMs using light signals according to the present invention. By separating the read-write (R/W) logic from the RAM proper, and driving individual diode laser sources with each of the required accessing signals, optical R/W signals are produced. These light signals can then be directed to the required locations on the RAM by a holographic optical element (HOE), not shown for simplicity, in the manner of the prior art depicted and discussed above. In the present invention, special gate circuits, called optical gate cells (OGCs), consisting of an optical detector—such as a photodiode—and an inverter, are used to transform the optical light signals to electronic logic level electrical signals usable by the RAM cells. Several tested examples of OGCs according to the present invention will be described in detail later herein.

The HOE, which is an existing device and no part of the novelty of this invention, is functionally equivalent to a focusing lens or mirror, which intercepts the light signal, directed away from the plane of the wafer, and refocuses the light at the required point. Unlike a conventional lens or mirror, the HOE can superimpose a number of optical elements into a single component, so that one source can be simultaneously imaged onto several detectors, for optical fanout. This capability is ideally suited to the broadcasting of the clock signals. Typically the same clock signal is used for all the memory cells 20; thus, optical broadcast clock distribution provides an efficient method of providing timing for the RAM memory 10' residing on a single chip. Using current silicon VLSI technology, a single laser source could broadcast a clock signal via a HOE to a two-dimensional array of silicon detectors, each placed at a memory cell. Thus, in its most basic embodiment as depicted in FIG. 6, the RAM memory 10' comprises an X-decoder and laser driver 26' which is connected to receive the row address information from the address line 16, decode it, and drive the appropriate row laser 48 which sends a light signal to the associated row detector or OGC 50 for the addressed row 22 of the RAM 10'. There is also a corresponding Y-decoder and laser driver 28' which is connected to receive the column address information from the address line 16, decode it, and drive the appropriate column laser 52 which sends a light signal to the associated column detector or OGC 54 for the addressed column 24 of the RAM 10'. A single clock-broadcasting laser 55 is the source of the optical clock signal which is broadcast by reflection of the HOE to the required multiple destinations as provided.

Figure 7:
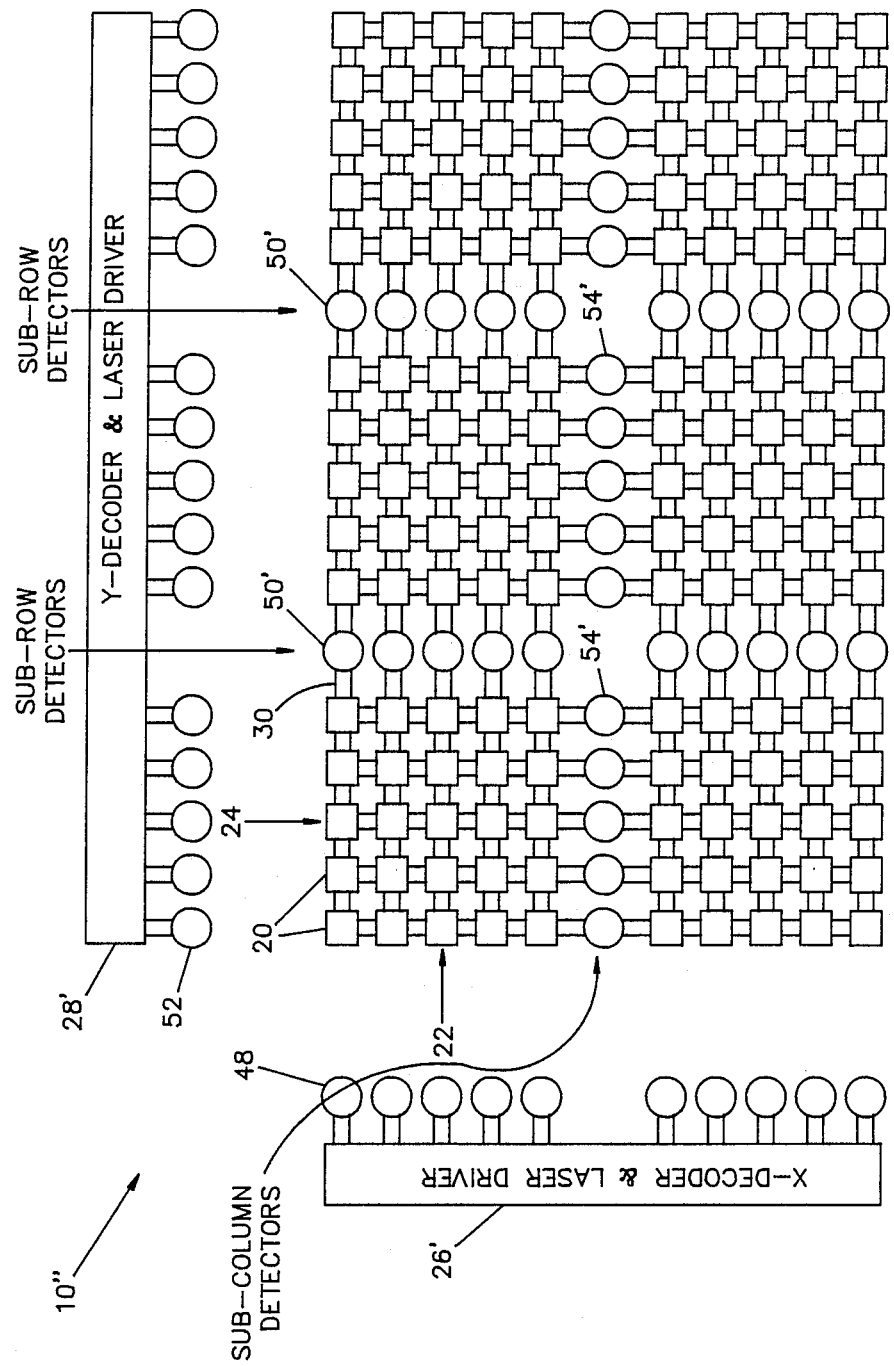
FIG. 7 is a simplified plan view of a memory according to the present invention in an alternate embodiment employing optical interconnections along with sub-row and sub-column interfaces.

By using a number of sub-row OGCs 50' along each memory cell row 22 and sub-column OGCs 54' along each memory cell column 24 to divide the length of the polysilicon conductive strips 30 into shorter lengths, the delay can be reduced proportionately, and thus the access time speeded up. This approach is shown in the embodiment of FIG. 7 wherein the RAM is generally indicated as 10''. Using a rather modest HOE fanout of four, for example, it can be shown that a speedup factor in access time of nearly ten can be achieved by driving the address lines by optical means. As an example, one can partition each existing address line into four, resulting in a commensurate reduction in the propagation delay of the lines. Furthermore, if each segment of conductive strip 30 is driven from its center, an additional factor of two in reduction of delay will be obtained, resulting in an overall eight-fold speedup. Higher fanout ratios will permit the overall RAM access speed to approach the memory cell speed asymptotically.

Figure 8:
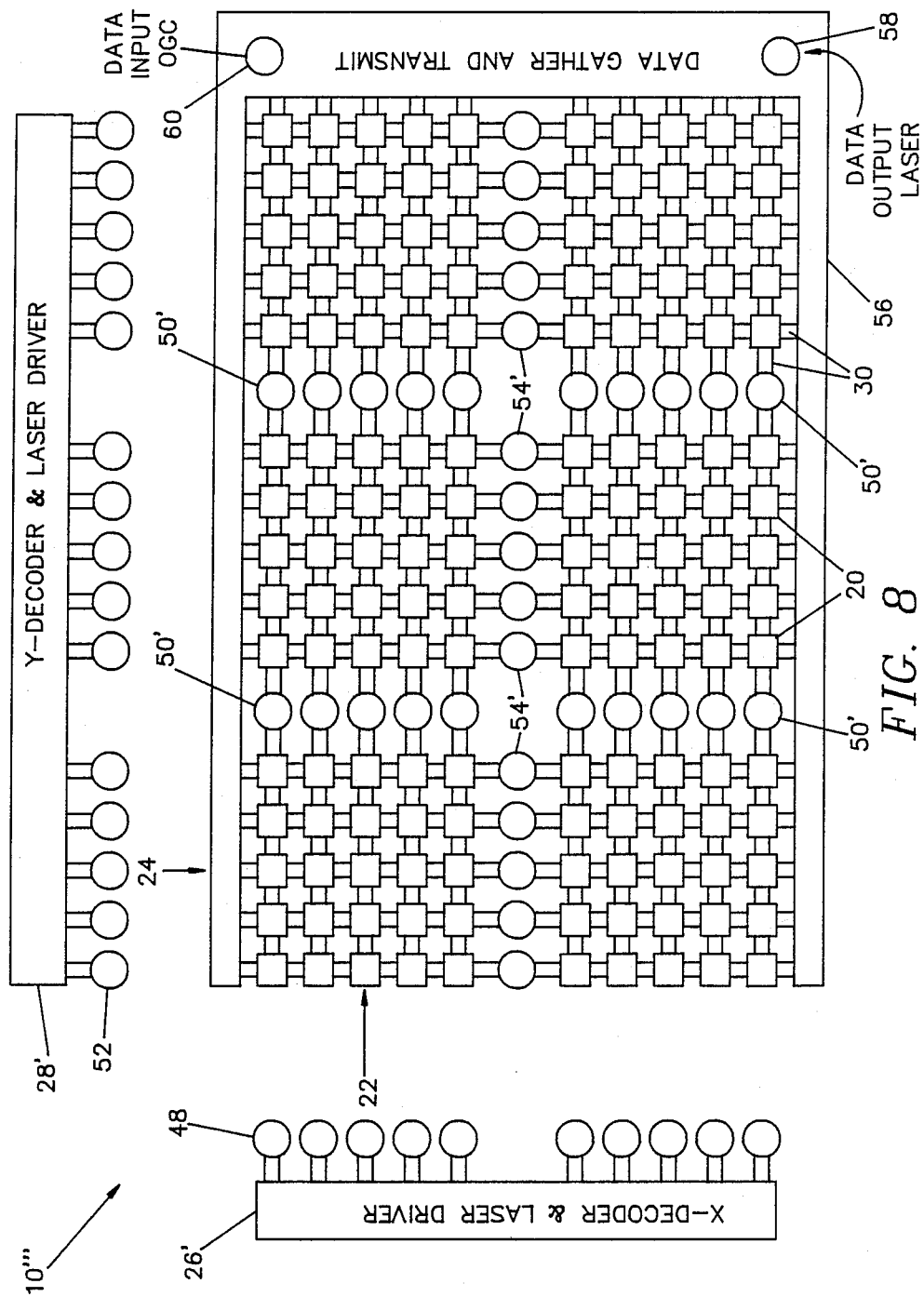
FIG. 8 is a simplified plan view of a memory according to the present invention in a preferred embodiment employing optical interconnections to and from the accessing computer.

The tested embodiments of the present invention, as shown in FIGS. 6 and 7, employed optical signal transmission only for addressing and clock distribution. The actual transfer of data to and from the RAM 10''' was over the solid wire and conductive paths of the prior art. In the preferred embodiment of the present invention as depicted in FIG. 8, data gather and transmit logic 56 interfaces with the memory cells 20 and communicates the data optically between the RAM 10''' and the computer (not shown) in the same manner as described above employing data output laser 58 and data input OGC 60. This embodiment will require the perfection of GaAs technology for the formation of the transmitting data output laser 58 as part of the RAM chip.

Figure 9:
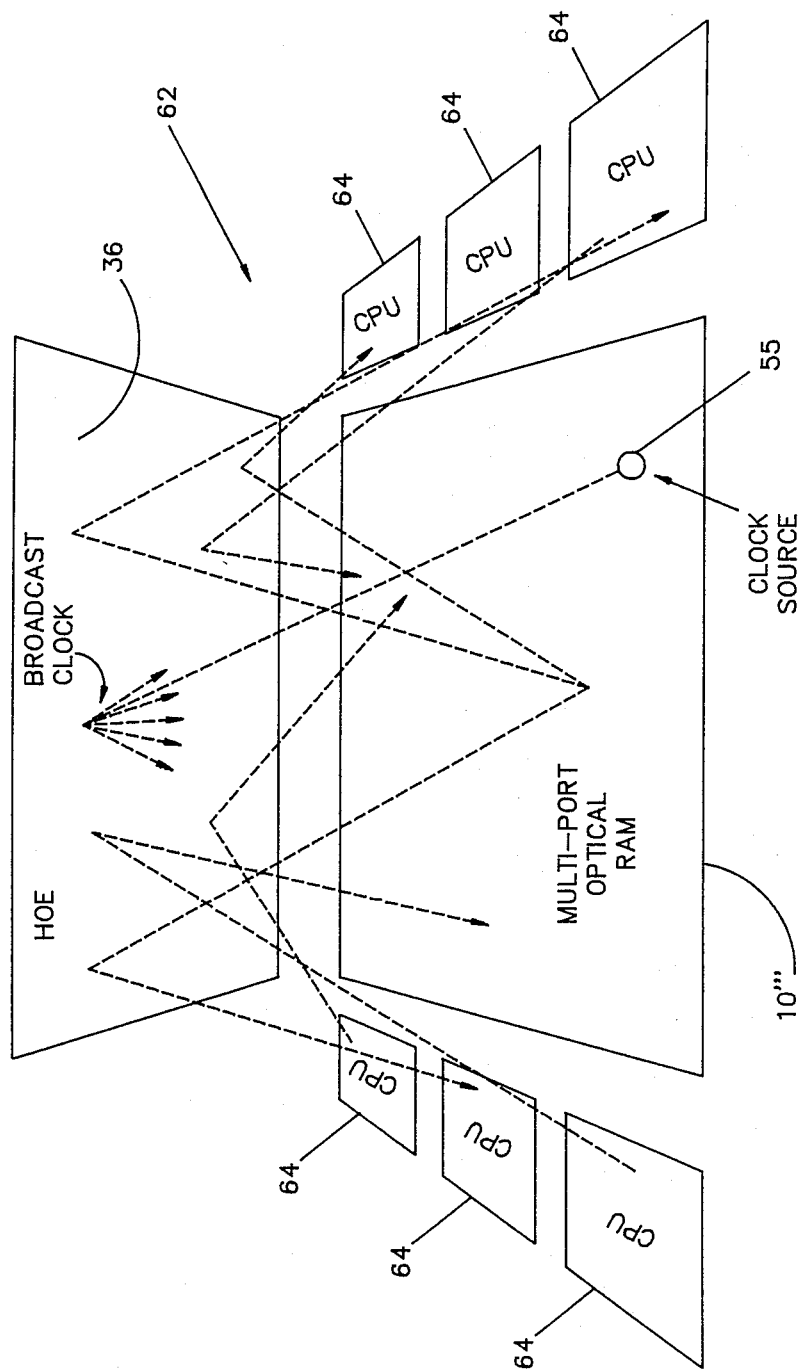
FIG. 9 is a perspective drawing in the manner of FIG. 5 showing a multi-processor system employing the memory of the present invention configured as a multi-port memory being accessed by a plurality of computers simultaneously.

As depicted in FIG. 9, the optically intra-connected and accessed memory of the present invention in its preferred embodiment provides the capability for a multiprocessor computer system 62 having virtually unlimited access to the shared multi-port optical ram 10'''. Whereas in the prior art the CPUs 64 had to be physically connected to the shared RAM limiting the number of accessing CPUs 64 to the available space for connective wiring on the RAM's chip, in the shared multi-port optical ram 10''' of the present invention, the limiting factor is the number of fanout positions capable of being provided by the HOE 36. To add a new CPU 64 to the system 62, the optical interconnection via the HOE 36 need only be established. Since a typical HOE 36 can provide millions of reflective points on its surface within an appropriate area, the number of accessing CPUs 64 possible is virtually unlimited. Note also the use of the single clock source laser 55 which is broadcast to the cells of the memory from the HOE 36 as described earlier herein.

Having thus described the present invention in its various embodiments in a general manner and having shown a multi-processor system with shared memory made possible by the present invention, the specifics of OGCs and tested embodiments of the applicants herein will now be described.

As mentioned earlier, the idea of holographic optical interconnects in VSLI is known in the art. The approach taken is to drive a semiconductor laser with a signal source and direct the laser output into a holographic optical element (HOE) that will image it to one or more photodetectors that receive the signal. It is worthy of note that the prior art referred to herein is the work of the applicants of this application; that is, the present invention is a new use for and incorporates further developments in the art originated by the applicants. In their incorporation, testing, and use of these prior art optical communications techniques, applicants chose a hybrid approach that combines discrete laser sources with photodetector gates integrated with electronic processing circuitry on a silicon chip, in order to make it possible to conduct system experiments such as the novel RAM addressing described herein. The potential applications can be at both chip scale and wafer scale. Applicants are using a 1K RAM chip previously developed at the Jet Propulsion Laboratory (JPL), where they work, as a first example in which to focus their study of optical interconnection techniques. The RAM chip was fabricated using a 3-um CMOS-bulk p-well process, through the MOS Implementation Service (MOSIS) available at JPL. In previous work, the applicants tested one type of optical gate cell that is compatible with the CMOS process with which the RAM chip is fabricated. The fall delay turned out to be much longer than the rise delay. The purposes of current work are to demonstrate free space optical interconnection by optically addressing a CMOS RAM, and to refine optical gate cell design to meet requirements compatible with CMOS circuitry. The intent is to insert optical gate cells in the 1K RAM chip, to be addressed by an optical signal which is emitted from a laser diode and is interconnected through a HOE. The OGC inserted is the one tested previously, which is shown in the circuit diagram of FIG. 10. It has a weak pull-down load and is thus termed the "weak pull-down OGC". The operation of such circuits is readily apparent to those skilled in the art and, therefore, in the interest of simplicity and to avoid redundancy, no detailed description of the operation of the circuits shown will be undertaken. A further description hereinafter presents the design and simulation of other examples of OGC circuits. Three designs are presented. The later designs reflect an attempt to control the pulse symmetry through various biasing techniques. SPICE simulation results of the three designs are summarized in Table 1. The measured short-circuit response time of the current p-n junction photodiode 66 is about 20 ns at a wave length of 0.83 $\mu$m. A goal of 1 to 5 ns response time seems achievable.

The concept of optically addressed RAM was discussed broadly earlier herein. The addressing circuitry of the tested embodiment drives the selected element in the laser array (e.g. in the decoders/drivers 26', 28'). The HOE images the laser beam to four Ogcs in a row of RAM cells. The purpose of the experiment was to bring together all the parts of an optical interconnect in a CMOS circuit and demonstrate system function. The RAM circuit implemented for the experiment was a silicon, CMOS/Bulk, 1024-bit static random access memory. A RAM was chosen because it is a quite simple structure. It is comprised of circuits typical of those found on most CMOS chips and it was a circuit easily available to the applicants. The RAM is based on the RAM circuit of the JPL CRRES chip as previously mentioned. The layout of the tested optical RA chip is organized into 64 rows of 16-bit words. Four columns of optical input cells, i.e. OGCs, were placed evenly among the 16 columns of SRAM (static random access memory) cells. Operation of the chip is fully static, employing a six-transistor memory cell and requiring four control pins to eliminate the need for any timing to be generated on-chip. For applicants' experiments, the RAM was modified to allow either full electrical addressing or optical addressing. In each of the 64 rows, four optical inputs were distributed on the row address line and a pass transistor placed on the output of the electrical address decoder to isolate the decoder from the internal circuitry when the chip is selected to be in the optical mode of operation.

The OGC was found to fit into approximately the same area as a six-transistor memory cell. The tested OGC consisted of a vertical p+n- photodiode as a pull-up device and a p-channel MOSFET as a weak pull-down device. The optical gate drove an inverter pair and the output of the inverter pair was used to drive a row select line of the RAM. The second inverter of the pair was tri-stated to isolate the optical gate cell from the row address line when electrically testing the chip. Four optical cells were put in each row to minimize the length of polysilicon address line needed to reach the furthest memory cell. This implementation causes minimal impact on the total chip area.

Optical gate cells for optical interconnection in VSLI are required to be monolithic and to have low complexity. Typical design requirements needed for compatibility with CMOS are as follows:
1. Logic family: Silicon, CMOS/Bulk logic family.
2. Size: Smaller than 100 μm by 100 μm.
3. Speed: Response time not more than 35 ns.
4. Dynamic Range: A fanout of ten from the HOE, which implies a dynamic range of 10 dB.
5. Sensitivity: Assuming a laser diode power output of 3 mW, a HOE efficiency of 20%, and a fanout of ten, the optical input power required to drive the receiver to a standard output logical "1" voltage level must be less than 60 μW.
6. Pulse Symmetry: Over the dynamic range of the receiver, the output pulse rise and fall times should remain as nearly equal as possible, thereby minimizing clock skew and increasing the predictability of pulse timing arrival.
7. Power Consumption: The power dissipated by the receiver should be small, preferably less than for comparable pad drivers.

The evolution of the OGC design of the applicants will be described in a simplified model and three prototypes: a minimum element design, a design optimized for balanced symmetry, a design optimized for high sensitivity and symmetry. Some discussion of future designs will also be mentioned.

Figure 10:
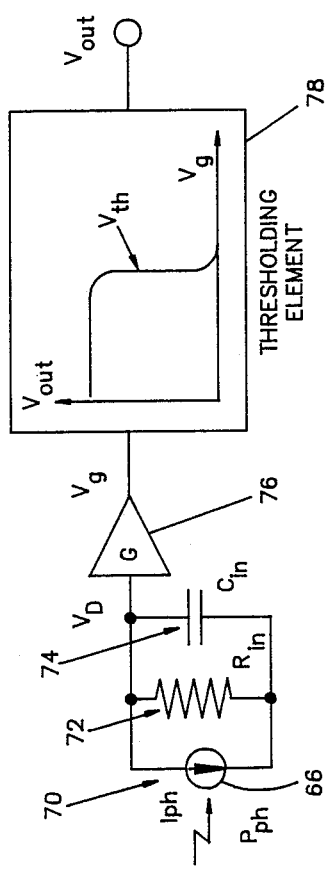
FIG. 10 is circuit diagram of a simplified optical gate cell model.

Simplified OGC Model—a functional model of the OGC circuit is shown in FIG. 10. It consists of a photocurrent source 70, resistive and capacitive load elements 72, 74, a gain stage 76, and lastly a (decision) threshold stage 78. Constraints of CMOS circuit design are not considered. Typical input conditions and component values are as follows:

| | |
|---|---|
| Photon Input Power | $P_{ph} = 60\ \mu W$ |
| Photocurrent | $I_{ph} = p\ P_{ph}; p = 0.5\ A/W$ |
| Input Resistance | $R_{in} = 100\ k\ ohm$ and up |
| Input Capacitance | $C_{in} = 10–100\ fF$ |
| Detector Node Voltage | $V_D$ |
| Gain, Gate Voltage | $G, V_g$ |
| Threshold Voltage | $V_{th}$ |
| Output Voltage | $V_{out}$ |

The input RC elements 72, 74 actually form a first gain stage and determine the initial amplification and bandwidth. A higher RC product directly translates to a greater sensitivity (but less bandwidth), thereby necessitating less post amplification. The intermediate gain stage (G) 76 boosts the signal level in order to decrease the voltage swing required from the detector. Finally, the threshold element 78 re-establishes the 1/0 output level.

The turn-on delay ($t_{on}$) is defined as the time from the onset of light impinging on the photodetector of the photocurrent source 70 to the time that the OGC voltage output passes 50%. $t_{on}$ is composed of two terms: $t_{on}$-D, the turn-on delay through the detector node, and $t_{off}$-D, the turn-on delay through the inverter, which is about 2 ns. Similar arguments apply to turn-off delay. By matching the initial and final conditions of $t_{on}$-D and $t_{off}$-D we obtain:

$$t_{on} \approx R_{in}C_{in} \ln\left( \frac{1}{1 - GpP_{ph}R_{in}/V_{th}} \right) + 2\ ns \approx$$

$$\frac{C_{in} V_{th}}{pP_{ph}G} + 2\ ns\ \text{for large}\ R_{in} \approx$$

$$11\ ns\ at\ G = 1, P_{ph} = 20\ \mu W, C_{in} = 30\ fF$$

Observe that this is approximately the same speed as the CMOS logic.

$$t_{off} \approx R_{in}C_{in} \ln\left( \frac{GpP_{ph}R_{in}}{V_{th}} \right) + 2\ ns$$

Observe that this depends largely on $R_{in}$.

Figure 11:
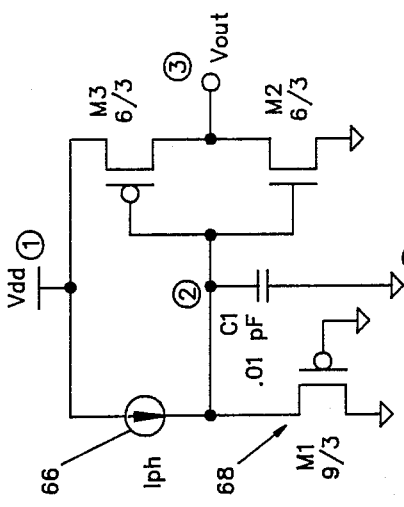
FIG. 11 is circuit diagram of one tested optical gate cell employed in the present invention.

Weak Pull-Down OGC—The simplest OGC consists of a detector, resistive load, and amplifier/decision stage realized by a two transistor inverter as shown in FIG. 11. With an optical input, the detector delivers a constant current to the inverter node. When the light turns off, the pull-down element (M1) provides a discharge path for the charge storage in the stray capacitive elements connected to this node. The inverter switches abruptly at about 2.5 V, thus providing some edge sharpening and thresholding. One problem with the weak pull-down OGC is that the resistance of the active load changes dynamically over several decades as the light turns on or off. Furthermore, the circuit conditions are different for the rise and fall states, contributing to asymmetry. Assuming $C_{in}=30fF$, $R_{in}=1M$ ohm, from the equations above, $t_{on}=11$ ns and $t_{off}=44$ ns, which agree quite well with the SPICE simulation results shown in Table 1, it was experimentally determined that the load resistance is over a megohm when current approaches zero. The experimentally determined asymmetry in delay times is more serious than predicted by SPICE simulation.

Figure 12:
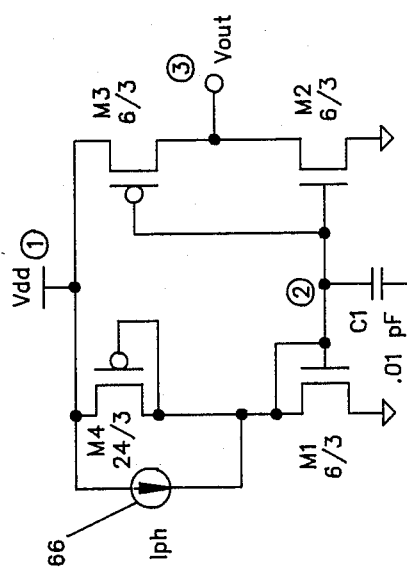
FIG. 12 is circuit diagram of another tested optical gate cell employed in the present invention.

Low Impedance OGC—an improvement on the simple OGC design may be made by changing M1 to an N-type device and reconfiguring the lower portion of the input node (M1 and M2) into a current mirror as shown in FIG. 12. The photocurrent impressed on the drain of M1 now appears at the drain of M2, thereby improving linearity. Discharge, however, is still a problem; but, can be controlled by adding a pull-up load (M4) that biases M1. Since M1 never turns off, its impedance is more regulated toward the low range (100 K ohm), which improves both the symmetry and speed. Another advantage is that the detector node voltage can be prebiased closer to the inverter threshold, thereby improving the sensitivity and symmetry somewhat more. A disadvantage is that more real-estate and greater power is consumed by adding bits. Also, noise immunity from the supply rails may be degraded. This effect can be especially significant in CMOS logic.

Figure 13:
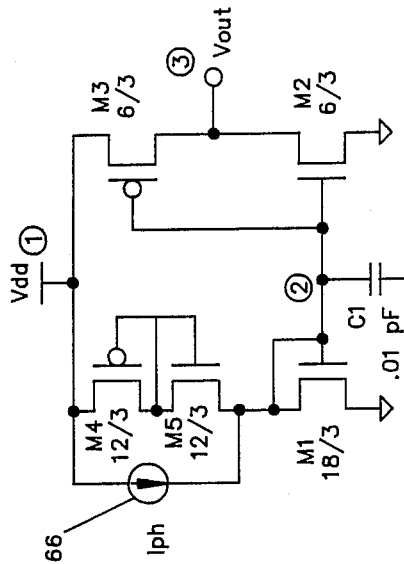
FIG. 13 is circuit diagram of still another tested optical gate cell employed in the present invention.

High Impedance OGC—A further improvement in the sensitivity and power consumption can be made by increasing the Thevenin equivalent impedance of the pull up/down divider until the RC time constant becomes approximately equal to the logic speed. One way of implementing this while maintaining some linearity is to use a cascaded P-type/N-type pair, as shown in FIG. 13. The values shown result in a 20% improvement in the sensitivity and a four-fold decrease in the quiescent current consumption.

While the currently developed OGCs described above possess stable performance, good symmetry, and speed, their sensitivity still lies far below the state of the art in fiber optic receiver technology employing discrete components. About a 30 dB improvement is still possible, decreasing the present 10 $\mu$W sensitivity to about 10 nW for a 20 MHz bandwidth. Such sensitivities are only possible by one of two approaches: (1) increasing the load resistance and providing post-amplifier equalization (also called an integrating front-end, since the detector node waveshape is typically slower than the desired bit rate), or (2) employing a transimpedance amplifier. The former has a limited dynamic range if the bit rate is expected to vary over a large range, while the latter is generally more complex and has slightly less sensitivity, but can tolerate very large range of bit rates and input signal levels. Both of these are to be investigated in future work.

A summary of the performance of the three previously described OGC circuits is shown in Table 1. Observe that the weak pull-down OGC of FIG. 11 possesses a moderate amount of pulse asymmetry. It did, however, have the best sensitivity (5 $\mu$A) and lowest current consumption (1.7 $\mu$A). The high impedance OGC of FIG. 13 provides a great improvement in both the speed and symmetry while increasing the current consumption only slightly (to 2.0 $\mu$A). Finally, the low impedance OGC of FIG. 12 has the fastest response, very good symmetry, but at a sacrifice of four-fold increase in current consumption.

In general, the response of a photodiode is limited by a combination of three factors: drift time in the depletion region, capacitance of the depletion region, and diffusion of carriers. For a vertical diode of 6 $\mu$m $\times$ 6 $\mu$m, the drift time is negligible, but carriers generated outside the depletion region must diffuse to the junction, resulting in considerable time delay. The diffusion time for holes which are the carriers collected by the junction in the detectors can be estimated by using the expression:

tp = Lp$^2$/ Dp where Lp is the absorption length of 10 $\mu$m at 830 nm, which is smaller than the hole diffusion length (0–100 $\mu$m), and Dp is the diffusion constant for holes in bulk silicon. With the setup used for measurement of response times of the photodiodes, the instrument resolution is a few nanoseconds. Experimental response times of the photodiodes were determined to be bout 20 ns under short-circuit conditions. It was concluded that this is mainly due to diffusion of carriers. Use of a shorter wavelength can reduce the diffusion time. From the above equation, the diffusion time is proportional to the square of penetration length. At a wavelength of 0.78 $\mu$m, the penetration length is reduced to half of that at, 0.83 $\mu$m; therefore, it is estimated that the diffusion time becomes 5 ns.

Other ways of diminishing the diffusion problem include: thicker depletion width, shorter life time by appropriate doping such as ion implantation; an n-well for enhancing recombination of deep carriers, or P-I-N instead of P-N junction photodiode. A goal of 1 to 5 ns response time is believed to be achievable by using shorter wavelength and/or an n-well.

It has been concluded previously that the optimal size for the p-channel transistor load in the weak pull-down load OGC will depend on the range of light power injected, as the impedance is current dependent. Adjustment of the active load resistance dependent on the range of light power injected will lead to balanced turn on/off delay.

From the equations provided earlier herein, in the equivalent circuit analysis, a value of $R_{in}$ can be derived that preserves OGC output waveshape symmetry. i.e., for symmetry:

$$t_{on} = t_{off} = R_{in} \approx 2\ V_{th}/pP_{ph} =$$

$$t_{on} = t_{off} \approx (1.386\ C_{in}\ V_{th}/pP_{ph}) + 2ns$$

$R_{in}$ is correlated with $V_{th}$ and $P_{ph}$ for symmetry. Also, ton (=toff) is about 12 ns, assuming light power is 20 $\mu$W, threshold voltage is 2.5 V, and input capacitance is 30 fF. Those agree quite well with the SPICE simulation results for the low impedance OGC.

As for the weak pull-down OGC, the impedance of the load becomes very large as the voltage across the drain and source of the load transistor drops below 1 V. It can be derived from the earlier equations herein that:

$$\text{for } t_{on} < t_{off},\ R_{in} > 2V_{th}/\ p\ P_{ph}$$

A numerical estimation gives a turn-on delay of 11 ns and turn-off delay of 44 ns (assuming a light input power of 20uW, threshold voltage of 2.5 V, input capacitance of 30 fF and input impedance of 1 M$\Omega$), which agree well with the SPICE simulation results. SPICE simulation results of the three designs—the weak pull-down OGC, the low impedance OGC and the high impedance OGC—are summarized in Table 1.

From SPICE simulation, it is determined that the low impedance OGC provides symmetrical turn on/off delay of 13 ns at 20 $\mu$W light power input. The dynamic range is about 10 dB and the size of the layout is about 70 $\mu$m by 70 $\mu$m. From 10 to 90 $\mu$W, the turn on/off delay appear fairly close, i.e., within 50% of each other. A full transimpedance design may provide 30 dB more sensitivity at additional component complexity and power consumption.

TABLE 1

| OGC CIRCUIT | Response time (@ 20 uW) | | Pmin (μW) | Pdyn (dB) | Symmetry | Area (μm²) | Idd (μA) |
| --- | --- | --- | --- | --- | --- | --- | --- |
| | $t_{on}$ (ns) | $t_{off}$ (ns) | | | | | |
| weak pull-down | 10 | 30 | 5 | — | poor | −602 | 1.7 |
| low Z | 13 | 13 | 10 | 10 | best | −702 | 8.3 |
| high Z | 12 | 22 | 8 | 8 | OK | −702 | 2.0 |

We claim:

1. In a binary computer memory having a plurality of storage cells for containing bits of binary information and logic at a location removed from close proximity to the storage cells for receiving information from an outside source directing access to ones of the storage cells, the improvement comprising:
   (a) first light source means associated with the logic for transmitting a first light beam with the access information modulated thereon;
   (b) first light detecting means associated with the storage cells for receiving said first light beam, for generating an electrical signal containing the access information, and for conducting said electrical signal to one of the storage cells to which it is directed; and,
   (c) reflecting means disposed between said first light source means and said first light detecting means for reflecting said first light beam from said first light source means to said first light detecting means.

2. The improvement to a computer memory of claim 1 wherein the storage cells are controlled by a clock signal and additionally comprising:
   (a) second light source means for transmitting a second light beam with the clock signal modulated thereon;
   (b) a plurality of second light detecting means associated with the storage cells for receiving said second light beam, for generating an electrical clock signal therefrom, and for conducting said electrical clock signal to the ones of the storage cells associated with respective ones of said second light detecting means; and,
   (c) said reflecting means including broadcast means for reflecting said second light beam from said second light source means to said plurality of second light detecting means.

3. The improvement to a computer memory of claim 1 wherein the storage cells are disposed at the intersections of a plurality of row conductors and a plurality of column conductors and wherein:
   (a) said first light source means includes a plurality of light beam-emitting sources corresponding to respective ones of said row conductors; and,
   (b) said first light detector means includes a plurality of light beam-detectors corresponding to respective ones of said row conductors.

4. The improvement to a computer memory of claim 3 wherein:
   (a) said first light source means includes a plurality of light beam-emitting sources corresponding to respective ones of said column conductors; and,
   (b) said first light detector means includes a plurality of light beam detectors corresponding to respective ones of said column conductors.

5. The improvement to a computer memory of claim 1 wherein the storage cells are disposed at the intersections of a plurality of row conductors and a plurality of column conductors and wherein:
   (a) said first light source means includes a plurality of light beam-emitting sources corresponding to respective ones of said row conductors; and,
   (b) said first light detector means includes a plurality of light beam detectors inserted into respective ones of said row conductors to divide said row conductors into sub-rows.

6. The improvement to a computer memory of claim 5 wherein:
   (a) said first light source means includes a plurality of light beam-emitting sources corresponding to respective ones of said column conductors; and,
   (b) said first light detector means includes a plurality of light beam detectors inserted into respective ones of said column conductors to divide said column conductors into sub-columns.

7. The improvement to a computer memory of claim 1 and additionally comprising:
   (a) data interfacing logic means connected to the storage cells for conducting data into and out of the storage cells;
   (b) third light source means operably connected to said data interfacing logic means for transmitting to the outside source a third light beam having data from the storage cells modulated thereon;
   (c) third light detecting means operably connected to said data interfacing logic means for receiving from the outside source a fourth light beam containing data to be written into the storage cells modulated thereon, for generating an electrical data signal therefrom, and for conducting said electrical data signal to said data interfacing logic means to be written by said data interfacing logic means into the ones of the storage cells to which it is directed; and,
   (d) said reflecting means including means for reflecting said third light beam from said third light source means to the outside source and for reflecting said fourth light beam from the outside source to said third light detecting means.

8. In a binary computer memory having a plurality of storage cells for containing bits of binary information and logic at a location removed from close proximity to the storage cells for receiving information from an outside source directing access to one of the storage cells, the improved method of operation comprising the steps of:
   (a) transmitting a first light beam with the access information modulated thereon from a light beam transmitting source;
   (b) receiving and reflecting the first light beam towards a first light beam detector at a first location removed from the site at which the first light beam is transmitted;
   (c) receiving the reflected first light beam at the first light beam detector at a second location removed from the site at which the first light beam is received and reflected;
   (d) generating an electrical signal containing the access information from the reflected first light beam; and,
   (e) conducting the electrical signal to the one of the storage cells to which it is directed.

9. The method of claim 8 wherein the storage cells are controlled by a clock signal and additionally comprising the steps of:
   (a) transmitting a second light beam with the clock signal modulated thereon from a second light beam source;
   (b) reflecting a plurality of the second light beams from the second light beam source towards a plurality of second light beam detectors associated with the storage cells;
   (c) receiving the plurality of reflected second light beams at the plurality of second light beam detectors;
   (d) generating electrical clock signals from the plurality of reflected second light beams at respective ones of the second light beam detectors; and,
   (e) conducting the electrical clock signals to the ones of the storage cells associated with respective ones of the second light beam detectors.

10. The method of claim 8 wherein the storage cells are disposed at the intersections of a plurality of row conductors and a plurality of column conductors and wherein:
   (a) said step of transmitting a first light beam with the access information modulated thereon from a first light beam transmitting source includes the step of transmitting the first light beams from one of a plurality of light beam-emitting sources corresponding to respective ones of the row conductors; and,
   (b) said step of receiving the reflected first light beam at the first light beam detector includes the step of receiving the first light beam at one of a plurality of first light beam detectors corresponding to respective ones of the row conductors.

11. The method of claim 8 wherein the storage cells are disposed at the intersections of a plurality of row conductors and a plurality of column conductors and wherein:
   (a) said step of transmitting a first light beam with the access information modulated thereon from a first light beam transmitting source includes the step of transmitting the first light beams from one of a plurality of first light beam-emitting sources corresponding to respective ones of the column conductors; and,
   (b) said step of receiving the reflected first light beam at the first light beam detector includes the step of receiving the first light beam at one of a plurality of first light beam-detectors corresponding to respective ones of the column conductors.

12. The method of claim 8 and additionally comprising the steps of:
   (a) connecting data interfacing logic means to the storage cells to transmit data into and out of the storage cells;
   (b) transmitting to the outside source from a third light beam source a third light beam having data from the storage cells modulated thereon;
   (c) receiving from the outside source at a third light beam detector a fourth light beam containing data to be written into the storage cells modulated thereon;
   (d) generating an electrical data signal from the fourth light beam; and,
   (e) conducting the electrical data signal to the data interfacing logic means to be written by the data interfacing logic means into the ones of the storage cells to which it is directed.

13. The method of claim 12 and additionally comprising the steps of:
   (a) reflecting the third light beam from the third light beam source to the outside source; and,
   (b) reflecting the fourth light beam from the outside source to the third light beam detector.

14. A binary computer memory for interfacing with a computer comprising:
   (a) a plurality of storage cells for containing bits of binary information;
   (b) interfacing logic means disposed at a location removed from close proximity to said storage cells for receiving information from the computer directing access to ones of said storage cells;
   (c) first light source means associated with said interfacing logic means for transmitting a first light beam with said access information modulated thereon;
   (d) first light detecting means associated said storage cells for receiving said first light beam, for generating an electrical signal containing said access information, and for conducting said electrical signal to the one of said storage cells to which it is directed; and,
   (e) reflecting means disposed between said first light source means and said first light detecting means for reflecting said first light beam from said first light source means to said first light detecting means.

15. The computer memory of claim 14 wherein said storage cells are controlled by a clock signal and additionally comprising:
   (a) second light source means for transmitting a second light beam with the clock signal modulated thereon;
   (b) a plurality of second light detecting means associated with said storage cells for receiving said second light beam, for generating an electrical clock signal therefrom, and for conducting said electrical clock signal to the ones of said storage cells associated with respective ones of said second light detecting means; and,
   (c) said reflecting means including broadcast means for reflecting said second light beam from said second light source means to said plurality of second light detecting means.

16. The computer memory of claim 14 wherein said storage cells are disposed at the intersections of a plurality of row conductors and a plurality of column conductors and wherein:
   (a) said first light source means includes a plurality of light beam-emitting sources corresponding to respective ones of said row conductors; and,
   (b) said first light detector means includes a plurality of light beam-detectors corresponding to respective ones of said row conductors.

17. The computer memory of claim 16 wherein:
   (a) said first light source means includes a plurality of light beam-emitting sources corresponding to respective ones of said column conductors; and,
   (b) said first light detector means includes a plurality of light beam detectors corresponding to respective ones of said column conductors.

18. The computer memory of claim 14 wherein said storage cells are disposed at the intersections of a plurality of row conductors and a plurality of column conductors and wherein:
(a) said first light source means includes a plurality of light beam-emitting sources corresponding to respective ones of said row conductors; and,
(b) said first light detector means includes a plurality of light beam detectors inserted into respective ones of said row conductors to divide said row conductors into sub-rows.

19. The computer memory of claim 18 wherein:
(a) said first light source means includes a plurality of light beam-emitting sources corresponding to respective ones of said column conductors; and,
(b) said first light detector means includes a plurality of light beam detectors inserted into respective ones of said column conductors to divide said column conductors into sub-columns.

20. The computer memory of claim 14 and additionally comprising:
(a) data interfacing logic means connected to said storage cells for conducting data into and out of said storage cells;
(b) third light source means operably connected to said data interfacing logic means for transmitting to the computer a third light beam having data from said storage cells modulated thereon;
(c) third light detecting means operably connected to said data interfacing logic means for receiving from the computer a fourth light beam containing data to be written into said storage cells modulated thereon, for generating an electrical data signal therefrom, and for conducting said electrical data signal to said data interfacing logic means to be written by said data interfacing logic means into the ones of said storage cells to which it si directed; and,
(d) said reflecting means including means for reflecting said third light beam from said third light source means to the computer and for reflecting said fourth light beam from the computer to said third light detecting means.

21. A multi-port, binary computer memory for interfacing with a plurality of computers comprising:
(a) a plurality of storage cells for containing bits of binary information, said storage cells being disposed at the intersections of a plurality of row conductors and a plurality of column conductors;
(b) interfacing logic means disposed at a location removed from close proximity to said storage cells for receiving information from the computers directing access to ones of said storage cells;
(c) first light source means associated with said interfacing logic means for transmitting a first light beam with said access information modulated thereon, said first light source means including a plurality of light beam-emitting sources corresponding to respective ones of said row conductors;
(d) first light detecting means associated with said storage cells for receiving said first light beam, for generating an electrical signal containing said access information, and for conducting said electrical signal to the one of said storage cells to which it is directed, said first light detector means including a plurality of light beam detectors inserted into respective ones of said row conductors to divide said row conductors into sub-rows; and,
(e) reflecting means disposed between said first light source means and said first light detecting means for reflecting said first light beam from said first light source means to said first light detecting means.

22. The computer memory of claim 21 wherein said storage cells are controlled by a clock signal and additionally comprising:
(a) second light source means for transmitting a second light beam with the clock signal modulated thereon;
(b) a plurality of second light detecting means associated with said storage cells for receiving said second light beam, for generating an electrical clock signal therefrom, and for conducting said electrical clock signal to the ones of said storage cells associated with respective ones of said second light detecting means; and,
(c) said reflecting means including broadcast means for reflecting said second light beam from said second light source means to said plurality of second light detecting means.

23. The computer memory of claim 21 wherein said storage cells are disposed at the intersections of a plurality of row conductors and a plurality of column conductors and wherein:
(a) said first light source means includes a plurality of light beam-emitting sources corresponding to respective ones of said row conductors; and,
(b) said first light detector means includes a plurality of light beam-detectors corresponding to respective ones of said row conductors.

24. The computer memory of claim 23 wherein:
(a) said first light source means includes a plurality of light beam-emitting sources corresponding to respective ones of said column conductors; and,
(b) said first light detector means includes a plurality of light beam detectors corresponding to respective one of said column conductors.

25. The computer memory of claim 24 wherein:
(a) said first light source means includes a plurality of light beam-emitting sources corresponding to respective ones of said column conductors; and,
(b) said first light detector means includes a plurality of light beam detectors inserted into respective ones of said column conductors to divide said column conductors into sub-columns.

26. The computer memory of claim 21 and additionally comprising:
(a) data interfacing logic means connected to said storage cells for conducting data into and out of said storage cells;
(b) third light source means operably connected to said data interfacing logic means for transmitting to the computers a third light beam having data from said storage cells modulated thereon;
(c) third light detecting means operably connected to said data interfacing logic means for receiving from the computers a fourth light beam containing data to be written into said storage cells modulated thereon, for generating an electrical data signal therefrom, and for conducting said electrical data signal to said data interfacing logic means to be written by said data interfacing logic means into the ones of said storage cells to which it is directed; and,
(d) said reflecting means including means for reflecting said third light beam from said third light source means to the computers and for reflecting said fourth light beam from the computers to said third light detecting means.

27. A multi-port, binary computer memory for interfacing with a plurality of computers comprising:
(a) a plurality of storage cells for containing bits of binary information, said storage cells being disposed at the intersections of a plurality of row conductors and a plurality of column conductors;
(b) interfacing logic means disposed at a location removed from close proximity to said storage cells for receiving information from the computers directing access to ones of said storage cells;
(c) first light source means associated with said interfacing logic means for transmitting a first light beam with said access information modulated thereon, said first light source means including a plurality of light beam-emitting sources corresponding to respective ones of said row conductors;
(d) first light detecting means associated with said storage cells for receiving said first light beam, for generating an electrical signal containing said access information, and for conducting said electrical signal to the one of said storage cells to which it is directed, said first light detector means including a plurality of light beam detectors inserted into respective ones of said row conductors to divide said row conductors into sub-rows;
(e) second light source means for transmitting a second light beam with the clock signal modulated thereon;
(f) a plurality of second light detecting means associated with said storage cells for receiving said second light beam, for generating an electrical clock signal therefrom, and for conducting said electrical clock signal to the ones of said storage cells associated with respective ones of said second light detecting means; and,
(g) reflecting means disposed between said first light source means and said first light detecting means and between said second light source means and said second light detecting means for reflecting said first light beam from said first light source means to said first light detecting means, said reflecting means including broadcast means for reflecting said second light beam from said second light source means to said plurality of second light detecting means.

28. The computer memory of claim 27 wherein said storage cells are disposed at the intersections of a plurality of row conductors and a plurality of column conductors and wherein:
(a) said first light source means includes a plurality of light beam-emitting sources corresponding to respective ones of said row conductors; and,
(b) said first light detector means includes a plurality of light beam-detectors corresponding to respective ones of said row conductors.

29. The computer memory of claim 28 wherein:
(a) said first light source means includes a plurality of light beam-emitting sources corresponding to respective ones of said column conductors; and,
(b) said first light detector means includes a plurality of light beam detectors corresponding to respective ones of said column conductors.

30. The computer memory of claim 29 wherein:
(a) said first light source means includes a plurality of light beam-emitting sources corresponding to respective ones of said column conductors; and,
(b) said first light detector means includes a plurality of light beam detectors inserted into respective ones of said column conductors to divide said column conductors into sub-columns.

31. The computer memory of claim 27 and additionally comprising:
(a) data interfacing logic means connected to said storage cells for conducting data into and out of said storage cells;
(b) third light source means operably connected to said data interfacing logic means for transmitting to the computers a third light beam having data from said storage cells modulated thereon;
(c) third light detecting means operably connected to said data interfacing logic means for receiving from the computers a fourth light beam containing data to be written into said storage cells modulated thereon, for generating an electrical data signal therefrom, and for conducting said electrical data signal to said data interfacing logic means to be written by said data interfacing logic means into the ones of said storage cells to which it is directed; and,
(d) said reflecting means including means for reflecting said third light beam from said third light source means to the computers and for reflecting said fourth light beam from the computers to said third light detecting means.

* * * * *